US010693460B1

(12) United States Patent
Takahashi et al.

(10) Patent No.: US 10,693,460 B1
(45) Date of Patent: Jun. 23, 2020

(54) FUSE ADJUSTABLE OUTPUT DRIVER

(71) Applicant: Micron Technology, Inc., Boise, ID (US)

(72) Inventors: Hiroki Takahashi, Kanagawa (JP); Shuichi Murai, Kanagawa (JP)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/544,451

(22) Filed: Aug. 19, 2019

(51) Int. Cl.
 *H03K 19/00* (2006.01)
 *G11C 11/4093* (2006.01)
 *H03K 19/0175* (2006.01)

(52) U.S. Cl.
 CPC ...... *H03K 19/0005* (2013.01); *G11C 11/4093* (2013.01); *H03K 19/017545* (2013.01); *G11C 2207/2254* (2013.01)

(58) Field of Classification Search
 None
 See application file for complete search history.

(56) References Cited

U.S. PATENT DOCUMENTS

| | | | | |
|---|---|---|---|---|
| 9,563,213 B2* | 2/2017 | Addepalli | ............. | G11C 16/06 |
| 9,870,808 B2* | 1/2018 | Lee | ........ | G06F 3/0608 |
| 9,935,632 B1 | 4/2018 | Gans | | |
| 10,348,527 B2* | 7/2019 | Tang | ................. | G11C 29/028 |
| 2010/0007375 A1* | 1/2010 | Lee | ............... | H03K 19/018585 |
| | | | | 326/30 |
| 2010/0097095 A1* | 4/2010 | Kao | ................... | H04L 25/0278 |
| | | | | 326/30 |
| 2011/0291699 A1* | 12/2011 | Cho | ................... | H04L 25/0278 |
| | | | | 326/30 |

* cited by examiner

*Primary Examiner* — Minh D A
*Assistant Examiner* — James H Cho
(74) *Attorney, Agent, or Firm* — Fletcher Yoder, P.C.

(57) ABSTRACT

Memory devices employ circuitry that may be used to adjust the output impedance. Embodiments describe herein relate to fuse-based adjustment circuitry that may be used to assist output impedance compensation such as ZQ calibration, and facilitate reduction in the dimensions and/or power consumption of the memory device.

23 Claims, 9 Drawing Sheets

FUSE ADJUSTABLE OUTPUT DRIVER

BACKGROUND

1. Field of the Present Disclosure

This disclosure relates to memory devices, and more specifically, to systems for calibration of output impedance of memory devices.

2. Description of Related Art

Memory devices, such as random access memory (RAM) devices, dynamic RAM devices (DRAMs), static RAM devices (SRAMs), or flash memories, are often used in electronic systems to provide memory functionality that facilitates data processing operations and/or facilitates data storage during data processing operations. To that end, these memory devices may have addressable memory elements that may be arranged in memory arrays and/or banks. These memory devices may also include an input/output (I/O) interface that provides data access between memory elements and processing circuitry (e.g., a processor, a microcontroller, a system-on-chip). The I/O interface of the memory device may be coupled to the memory elements through internal data paths that may include circuitry for reading or writing data bits in the memory elements.

Certain memory devices, such as a low power dynamic random access memory (LPDRAM) devices (and other similar memory devices), may use a calibration process (e.g., ZQ calibration) to tune output impedance in certain components, such as input/output drivers and/or on-die termination components. The calibration and tuning may be used to compensate for variations due to, for example, manufacturing process, effective operating voltage, and/or environmental factors such as temperature. In particular, the ZQ calibration process and tuning may use switching circuitry in output drivers to maintain a consistent output impedance to host processors coupled to the memory devices. The switching circuitry that implements ZQ-based calibration consumes power and occupies footprint in the memory device and, therefore, optimizations to the output impedance compensation circuitry may lead to smaller and/or more efficient memory devices.

BRIEF DESCRIPTION OF THE DRAWINGS

Various aspects of this disclosure may be better understood upon reading the following detailed description and upon reference to the drawings in which.

DETAILED DESCRIPTION

Figure 1:
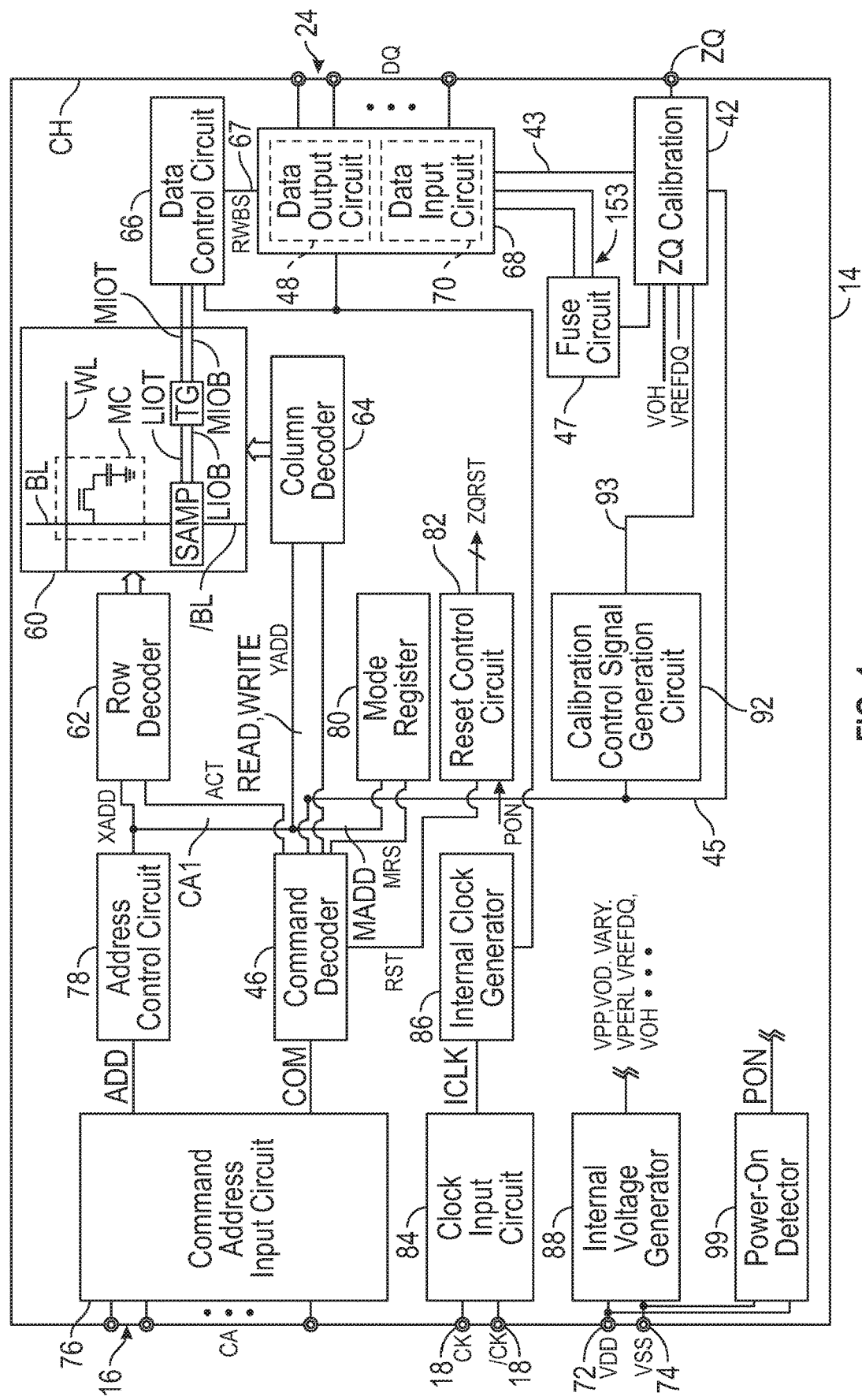
FIG. 1 is a schematic diagram of a memory device that may employ the fuse-based and switch-based output impedance calibration, in accordance with an embodiment.

One or more specific embodiments will be described below. In an effort to provide a concise description of these embodiments, not all features of an actual implementation are described in the specification. It may be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it may be appreciated that such a development effort may be complex and time consuming, but would nevertheless be a routine undertaking of design, fabrication, and manufacture for those of ordinary skill having the benefit of this disclosure.

Many electronic systems may employ memory devices to provide data storage functionalities and/or to facilitate the performance of data processing operations. Several memory devices may store data using addressable memory elements (e.g., memory cells), which may be disposed in memory banks or memory cell arrays. Examples of addressable memory devices include random access memories (RAMs) devices, dynamic RAM (DRAMs) devices, static RAM (SRAMs) devices, and/or flash memory devices, among others. Processing circuitry in the electronic systems may access (e.g., read/write) the memory elements by interacting with an input/output (I/O) interface and a command interface. As an example, a processor may read stored information from a particular memory element of the memory device by providing a read command and/or an address via the command interface, and retrieve the requested information (e.g., data bits) via the I/O interface.

The memory elements may store the data bits in a component that can hold a charge, such as a capacitor. For example, during a write process, a capacitor of a memory element may be configured to store a first voltage (e.g., 1V, 0.5V) associated with a first bit (e.g., TRUE) or a second voltage (e.g., 0V, −1V, −0.5V) associated with a second bit (e.g., FALSE). In order to read the stored voltage, the memory device may employ circuitry capable of sensing the stored voltage and transmitting the voltage to a data port. The data port, which may be connected to a host that may perform data processing operations, such as central processing unit (CPU), a microcontroller, a graphics processing unit (GPU), a digital signal processor (DSP), or any other similar digital system, should provide the signal with appropriate electrical characteristics (e.g., current, voltage, output impedance) to the host to properly receive the read data.

Thus, the electrical connection between the memory device and the host processor may be susceptible to impedance matching challenges and configuration circuitry coupled to the output data port may be used to configure the output impedance. That is, memory devices may include output impedance configuration circuitry that is coupled to the output data port to configure the output impedance in the data port. In some systems, the configuration of the output circuitry may include configurable output drivers (e.g., transistor devices) that may be electrically coupled to the output port during the ZQ calibration process. In such a system, the impedance configuration circuitry performs a ZQ calibration using a ZQ resistor as a reference impedance and may program the output drivers to contribute with the output signal (e.g., pull-up the output or pull-down the output) and adjust the output impedance accordingly.

The ZQ calibration process may be used to compensate for variations in the output impedance due to manufacturing process variations, temperature conditions, and/or voltage conditions. The variations due to the manufacturing process may be large and, as a result, the number of configurable output drivers that are made active may be large. This may result in increased switching currents due to the number of additional drivers, and increased metallization to provide the appropriate electrical connections to support the additional drivers.

Embodiments described herein relate to memory devices having sets of adjustable fuses that may be used to facilitate the performance of the output impedance configuration circuitry by providing a resistive configuration circuit. As such, the fuse circuitry may configure resistive elements between the output drivers and the output port (e.g., DQ terminal, data terminal) by adding transistor-coupled resistive elements to the circuit, as detailed below. The adjustable fuses may be used to perform an initial calibration that may compensate for large output impedance variations, such as due to variations in the manufacturing process, which may reduce the compensation of variations performed by the switch-based configurable output drivers. Thus, the fuse-based adjustment may be performed in addition to the switch-based adjustment performed during the ZQ calibration process.

With the foregoing in mind, FIG. 1 is a block diagram of a memory device 14 The memory device 14 may be a DDR4 (Double Data Rate 4) SDRAM (synchronous dynamic random access memory) integrated on a semiconductor chip, a DDR5 SDRAM integrated on a semiconductor chip, a LPDDR4 (Low Power Double Data Rate 4) type DRAM (dynamic random access memory) integrated on a single semiconductor chip, a LPDDR5 (Low Power Double Data Rate 5) type DRAM (dynamic random access memory) integrated on a single semiconductor chip, or any similar memory device. The memory device 14 may be provided with a channel coupled to an external terminal. The channel may facilitate read and/or write operations based on a command/address signal CA and/or external clock signals CK and/CK supplied from an external host processor.

The command/address signal CA and the external clock signals CK and/CK may be supplied to command/address terminals 16 and clock terminals 18 of the memory device 14. The command/address signal CA and the external clock signals CK and/CK are supplied to the channel by the host processor, to request the memory device 14 to perform operations such as read and/or write. For example, the CA signal may be used to request data from the memory device 14. In such a situation, the requested data may be read from DQ terminals 24 by the processor host. The CA signal may also be used to request storage of data by the memory device. In such a situation, the write data may be sent by the host processor to the DQ terminals 24. In the illustrated memory device, the DQ terminals 24 are bi-directional. In some embodiments, such as in LPDDR5, additional external clock signals WCK and/WCK may be used for clocking the DQ terminals 24, and the external clock signals CK and/CK may be used to clock the command/address signal CA. More generally, it should be understood that the clocking signals that synchronize the CA signal may differ from the ones that synchronize the DQ signals. In some embodiments, the memory device 14 may not allow write operations, but instead only allow read operations, such as in the case of a ROM (read only memory)-based semiconductor device.

Figure 2:
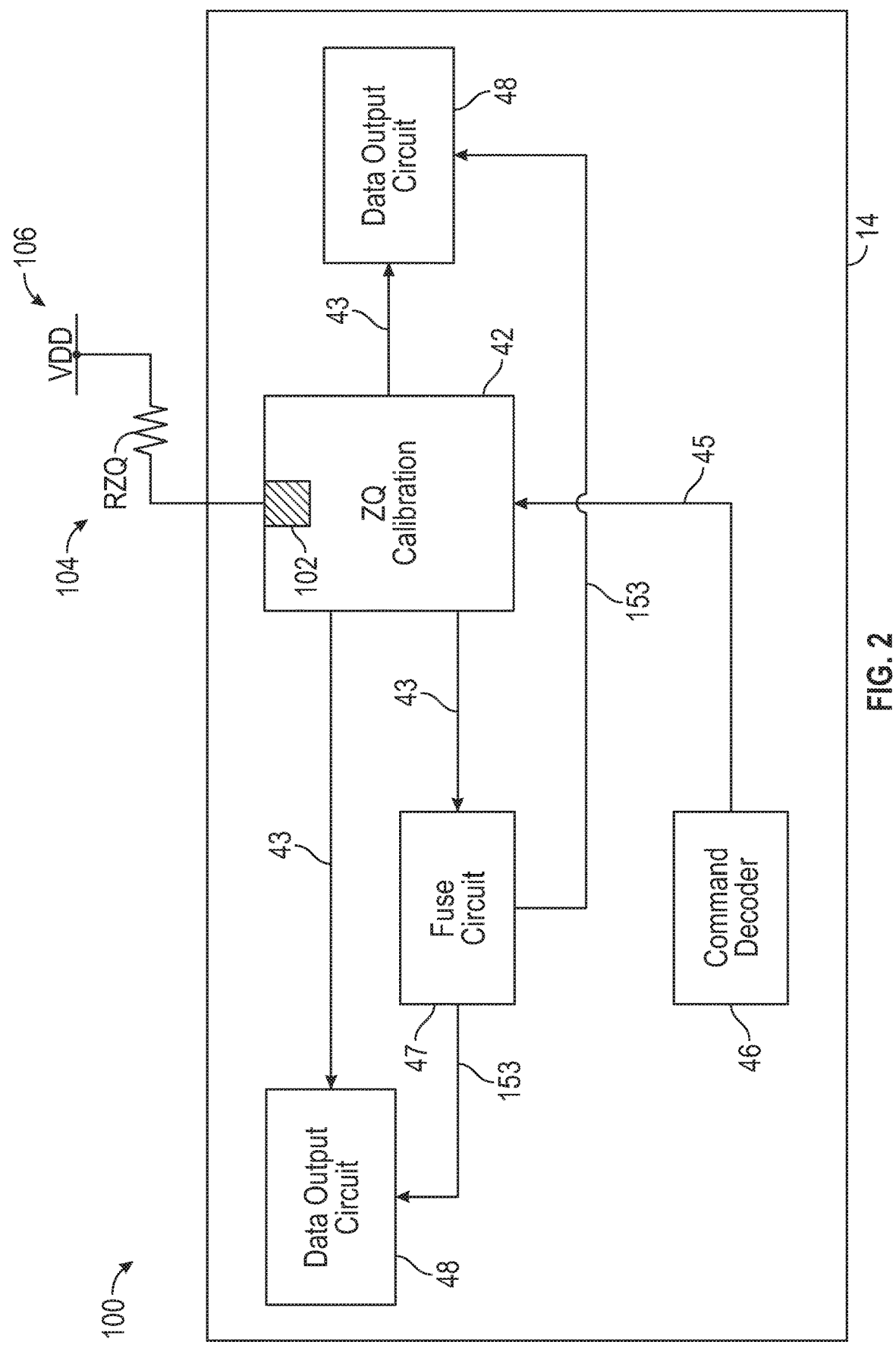
FIG. 2 is a schematic diagram of ZQ calibration circuitry and data output circuitry of a memory device, in accordance with an embodiment.

The memory device 14 may include calibration terminals ZQ. Each calibration terminal ZQ may couple to a respective channel of each semiconductor device 14. The performance of the calibration process using through calibration terminal ZQ is discussed in more detail with respect to FIG. 2. Referring briefly to FIG. 2, the system may include a ZQ calibration controller 42. The ZQ calibration controller 42 may generate adjustments to data output circuits 48 based on a voltage of the calibration terminal ZQ. To that end, the ZQ calibration controller 42 may send an adjustment signal 43 to the data output circuit 48 and or to a fuse circuit 47. In some embodiments, a calibration execution signal 45 may be supplied from a command decoder 46 (e.g., via the calibration control signal generation circuit 92 of FIG. 1).

Returning to FIG. 1, the memory cell device 14 may have a memory cell array 60 that may be used to store data in the memory device 14. The memory cell array 60 may include word lines WL and bit lines BL and /BL, with memory cells MC disposed at intersections of the word lines WL and bit lines BL and /BL. A row decoder 62 may select word lines WL, while a column decoder 64 may select bit lines BL and /BL. The bit lines BL and /BL may be paired and coupled to a sense amplifier SAMP of the memory cell array 60. The sense amplifier SAMP may amplify a voltage difference generated between the bit lines BL and /BL. The sense amplifier SAMP may also supply read data based on the voltage difference generated between the bit lines BL and /BL to complementary local input/output lines LIOT/LIOB. The read data supplied to the local input/output lines LIOT/LIOB may be transferred to complementary main input/output lines MIOT/MIOB via a switch circuit TG. The read data on the main input/output lines MIOT/MIOB may then be transmitted by a data control circuit 66 to a data input/output circuit 68 via a read/write bus RWBS. The data input/output circuit 68 may include the data output circuit 48 and a data input circuit 70.

The channel of the memory device 14 may include the command/address terminals 16, the clock terminals 18, the data terminals 24, voltage terminals 72 and 74, and the calibration terminal ZQ, as discussed above. The command/address signals CA may be received via the command/address terminals 16 and sent to a command/address input circuit 76. The command/address signals CA may include address signals ADD and command signals COM. The address signals ADD may be sent to an address control circuit 78, while the command signals COM may be sent to the command decoder 46.

The address control circuit 78 may supply row addresses XADD to the row decoder 62 and column addresses YADD to the column decoder 64 based on the address signals ADD.

The address control circuit 78 may also supply a mode signal MADD to a mode register 80 if there is an entry in a mode register set MRS. The mode register 80 may include a circuit that sets a parameter representing an operation mode of the channel. The command decoder 46 may include a circuit that generates internal commands by decoding the command signals COM. For example, the command decoder 46 may generate active signals ACT, read signals READ, write signals WRITE, mode-register-set signals MRS, the calibration execution signals 45, reset signals RST, and the like.

The active signal ACT may include a signal that is transmitted if the command signal COM indicates accessing a row (e.g., an active command). For the purposes of the present disclosure, a signal may be transmitted or sent when the signal is driven to a specific level (e.g., low level, high level). When the active signal ACT is transmitted, the row address XADD latched in the address control circuit 78 may be supplied to the row decoder 62. The word line WL specified by the row address XADD may then be selected.

The read signal READ and the write signal WRITE may include signals that are transmitted if the command signals COM indicate a read command and a write command. When the read signal READ or the write signal WRITE is transmitted, the column address YADD latched in the address control circuit 78 may be supplied to the column decoder 64. The bit line BL or/BL specified by the column address YADD may then be selected.

Therefore, if an active command and a read command are both transmitted, and the row address XADD and the column address YADD are input synchronously with the active command and the read command, then the read data DQ may be read from the memory cell MC specified by the row address XADD and the column address YADD. The read data DQ may be output from the data terminal 24 via the data control circuit 66 and the data output circuit 48 (e.g., disposed in the data input/output circuit 68). If an active command and a write command are both transmitted, and the row address XADD and the column address YADD are input synchronously with the active command and the write command, then the write data DQ may be input to the data terminal 24. Thus, the write data DQ may be supplied to the memory cell array 60 via the data input circuit 70 (e.g., disposed in the data input/output circuit 68) and the data control circuit 66, and written to the memory cell MC, which may be specified by the row address XADD and the column address YADD.

The external clock signals CK and/CK may be input to the clock terminals 18. The external clock signal CK and the external clock signal/CK may be mutually complementary signals, and both may be supplied to a clock input circuit 84. The clock input circuit 84 may receive the external clock signals CK and/CK and generate an internal clock signal ICLK. The internal clock signal ICLK may be used as a timing signal that defines operation timing of circuit blocks of the channel, such as the address control circuit 78 and the command decoder 46. The internal clock signal ICLK may also be supplied to an internal clock generator 86, which may generate a phase-controlled internal clock signal based on the internal clock signal ICLK. In some embodiments, the internal clock generator 86 may include a DLL (delay locked loop) circuit. The phase-controlled internal clock signal LCLK may be supplied to the data input/output circuit 68 and used as a timing signal for determining output timing of the read data DQ.

The voltage terminals 72 and 74 may receive power-source potentials VDD and VSS. The power-source potentials VDD and VSS may be supplied to an internal voltage generator 88. The internal voltage generator 88 generates various internal potentials VPP, VOD, VARY, and VPERI and reference potentials VREFDQ and VOH based on the power-source potentials VDD and VSS, which may be provided to circuitry in the memory device from stable power sources. For example, the internal potential VPP may be used in the row decoder 62, the internal potentials VOD and VARY may be used in the sense amplifier SAMP, and the internal potential VPERI may be used in other circuit blocks. As discussed below, the stable power sources may be used to configure the fuses in the data output circuits 48.

The voltage terminals 72 and 74 may also be coupled to a power-on detector 90. The power-on detector 90 may include a circuit that determines whether electrical current is flowing at the voltage terminals 72 and 74. If electrical current is determined to be flowing at the voltage terminals 72 and 74, the power-on reset signal PON may be transmitted. The power-on reset signal PON may be supplied to circuit blocks of the channel and the circuit blocks may be reset.

A calibration control signal generation circuit 92 may generate the calibration control signal 93. The calibration control signal generation circuit 92 may send the calibration control signal 93 in response to receiving the calibration execution signal 45 supplied from the command decoder 46. The calibration control signal generation circuit 92 may include timing circuitry, such as a timer, that enables transmitting one or more calibration control signals 93 (e.g., periodically and/or at predetermined intervals) based on receiving the calibration execution signal 45. For example, the calibration control signal generation circuit 92 may receive the calibration execution signal 45, a n number of calibrations to perform, and a period of the calibrations, and transmit n calibration control signals 93, each separated by the period.

FIG. 2 is a schematic diagram 100 of the ZQ calibration system that may be used to calibrate the data output circuits 48 of the memory device 14 of FIG. 1. As discussed above, the command decoder 46 may begin the ZQ calibration process by transmitting a calibration execution signal 45 to the ZQ calibration controller 42. The calibration terminal ZQ may be coupled to a respective power-source potential VDD 106 via a reference resistor RZQ 104, which may be provided by a memory module substrate or a motherboard. The ZQ calibration controller 42 may, then, sense a voltage in a sensor 102 and determine adjustments to the output impedance that takes the voltage in the sensor 102 to a target level.

Based on the data from sensor 102, the ZQ calibration controller 42 may select and transmit calibration adjustment signals 43, which may be used to program data output circuits 48. In certain embodiments, the adjustment signals 43 may be used to perform programming of the switch-based configurable output drivers or of the fuse-based impedance adjustment circuitry. To that end, adjustment signals 43 may be provided to a fuse circuit 47, which may determine a fuse signal 153 transmitted to the configurable output drivers. In certain embodiments, the fuse adjustment may be performed less frequently and may be used to compensate for variations due to the fabrication method whereas the switch adjustment may be performed regularly, to compensate for variations due to temperature, voltage, or other environmental conditions.

Figure 3:
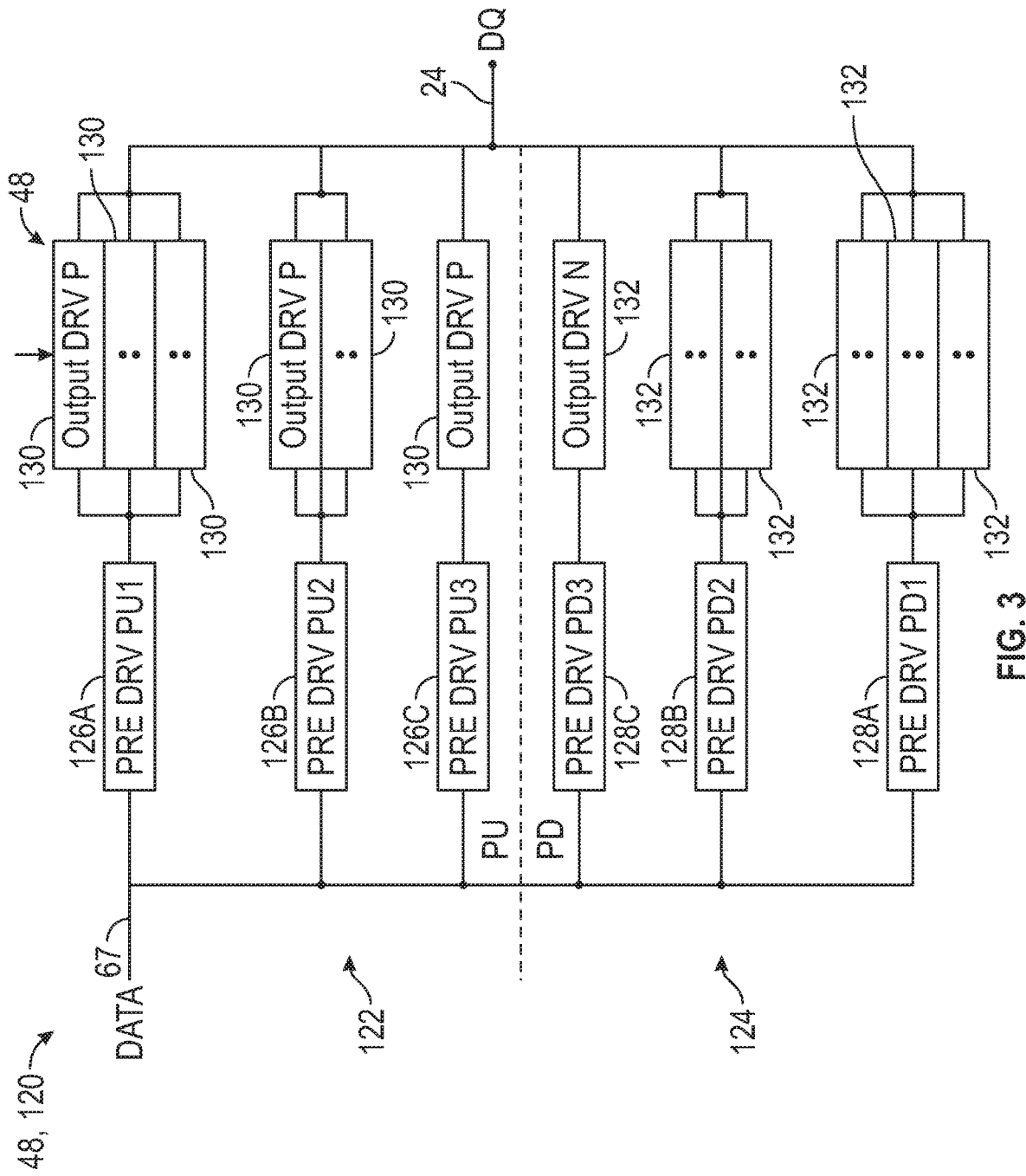
FIG. 3 is a schematic diagram of a data output circuit that may have fuse-configurable resistors for ZQ calibration, in accordance with an embodiment.

With the foregoing in mind, FIG. 3 illustrates a diagram 120 of a data output circuit 48. As discussed above, the data output circuit 48 may be used to provide data read from memory cells to a host processor. The data may be received from the memory cells via the read and write bus 67 and may be provided to the host processor via data terminal 24. In the illustrated example, the data output circuit 48 may include 3 pull-up units 122, PU1, PU2, and PU3, and 3 pull-down units 124, PD1, PD2, and PD3. Embodiments may, generally, have any suitable number of pull-up units or pull-down units (e.g., 1, 2, 3, 5, 7, 10, 15, 20, 40, 50, and 100). As illustrated, the output nodes of the pull-up units 122 and the pull-down units 124 may be commonly coupled to the data terminal 24.

Each pull-up unit may have a pull-up pre-output driver and one or more pull-up output drivers. For example, pull-up units 122 include pull-up unit PU1 having pull-up pre-output driver 126A coupled to 3 pull-up driver modules 130, pull-up unit PU2 having pull-up pre output driver 126B coupled to 2 pull-up driver modules 130, and pull-up unit PU3 having pull-up pre-output driver 126C coupled to a single pull-up driver module 130. Similarly, each pull-down unit may have a pull-down pre-output driver coupled to one or more pull-down output drivers. For example, pull-down units 124 include pull-down unit PD1 having pull-down pre-output driver 128A coupled to 3 pull-down driver modules 132, pull-down unit PD2 having pull-down pre-output driver 128B coupled to 2 pull-down driver modules 132, and pull-down unit PD3 having pull-down pre-output driver 128C coupled to a single pull-down driver module 132.

Each pull-up unit PU may form a pair with a corresponding pull-down unit PD. The number of the units of pull-up driver modules 130 and/or pull-down driver modules 132 used may be adjusted based on a desired output impedance. The enabling and/or disabling of the pull-up driver modules 130 or of the pull-down driver modules 132 may be performed by the corresponding pre-output drivers (e.g., pull-up pre-output drivers 126A, 126B, 126C, pull-down pre-output drivers 128A, 128B, 128C). As detailed below, the fuse-based adjustment may allow a simplified control of the pull-up driver modules 130 and/or of the pull-down driver modules 132 by allowing a common control of the switch-based adjustment. For example, during an initial fuse-based configuration of the pull-up driver modules 130, the fuses in each driver may be set such that the output impedance of each pull-up driver is similar to the others. As a result, the switch-based configuration during periodic ZQ calibrations may operate by providing a common programming signal to all pull-up driver modules 130, without individual adjustments. Such application may allow a more precise and/or faster output impedance adjustment.

Figure 4:
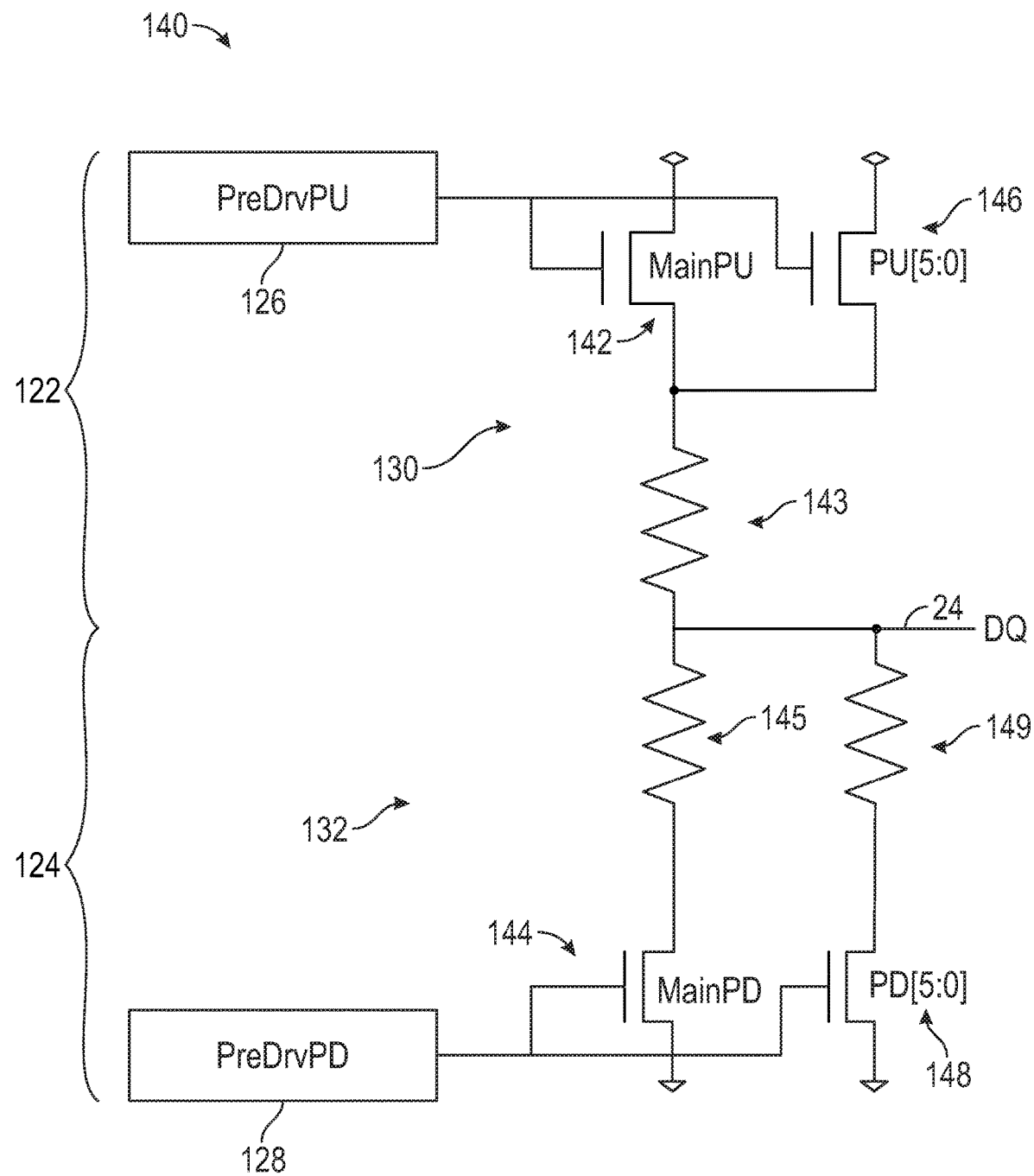
FIG. 4 is an electrical circuit illustrating switch-based adjustment of the output impedance of data circuitry, which may be adjusted during ZQ calibration.

FIG. 4 illustrates a data output circuit 140 having only a switch-based output impedance adjustment. The data output circuit 140 has a single pull-up unit 122 and a single pull-down unit 124. The pull-up unit 122 may have a pull-up pre-output driver 126 and a pull-up driver module 130 and the pull-down unit 124 may have a pull-down pre-output driver 128 and a pull-down driver module 132. The pull-up driver module 130 may have a main pull-up driver 142, which may be coupled to the data terminal 24 through a resistive element 143. The pull-up driver module 130 may also have programmable pull-up drivers 146 that may be used to adjust the output impedance during ZQ calibration. The illustrated programmable pull-up drivers 146 include 6 switches that may be disposed in parallel with the main pull-up driver 142 and that may be activated to adjust the output impedance from the pull-up driver module 130. The programmable pull-up drivers 146 may be programmed by the adjustment signal 43A that, as discussed above, may be generated during a ZQ calibration cycle.

Similarly, the pull-down driver module 132 may include a main pull-down driver 144 and programmable pull-down drivers 148. The main pull-down driver 144 may be coupled to the data terminal 24 via a resistive element 145 and the programmable pull-down drivers 148 may be coupled to the data terminal 24 via resistive couplings 149. The illustrated diagram include 6 parallel branches having pull-down drivers 148 and resistive couplings 149 that may be disposed in parallel with the main pull-down driver 144 and the resistive element 145. As with the programmable pull-up drivers 146, programmable pull-down drivers 148 may be programmed by the adjustment signal 43B that, as discussed above, may be generated during the ZQ calibration cycle. While in the diagram, the pull-up driver module 130 and the pull-down driver module 132 may have different architectures, the data output circuit may be designed in a symmetric manner. For example, in some embodiments, the drain of pull-up driver 146 may be connected to the data terminal 24 through a separate resistor, instead of being connected through the resistive element 143. In some embodiments, the source of pull-down driver 148 may be directly coupled to the source of the main pull-down driver 144, instead of being connected through resistive element 149.

As illustrated, the transistors in the output data circuit (e.g., main pull-up driver 142, main pull-down driver 144, programmable pull-up drivers 146, and programmable pull-down drivers 148) and the resistive members or elements (e.g., resistive elements 143, 145, and 149) may be responsible for the output impedance at the data terminal 24. The transistors and resistors (e.g., resistive elements, metallization) may suffer variations in the electrical characteristics due to imperfections in the manufacturing process, temperature conditions, and/or voltage conditions. Moreover, the number of active transistors and drivers may be changed due to a mode of operation of the memory device 14. As such, the adjustment signals 43A and 43B may be used to activate or deactivate programmable drivers 146 and 148, respectively, to adjust the output impedance. Such a process may be performed during the ZQ calibration. As discussed above with reference to FIG. 2, the ZQ circuit may use a reference resistance RZQ that simulates the output circuit. By monitoring the voltage, the ZQ calibration circuit may select the value of adjustment signals 43A and 43B that may adjust, precisely, the output impedance at the data terminal 24.

The system illustrated in FIG. 4 relies solely on switch-based programmable drivers to compensate for fluctuations in electrical characteristics due to manufacturing processes, temperature, and/or voltage conditions. However, variations due to manufacturing process are relatively static for a given produced device, whereas temperature and/or voltage conditions may fluctuation during usage. As such, periodic performance of the ZQ calibration and periodic configuration of the programmable drivers 146 and 148 may be redundant, as the fluctuations due to manufacturing process are always re-measured and re-compensated. Moreover, the use of programmable drivers may increase the consumption of power and the operation time following the ZQ calibration. Certain devices may employ larger transistor devices and/or resistors to mitigate fluctuations due to the manufacturing process and the larger electrical components may consume extra current. The pre-output drivers 126 and 128 may, in turn, also become larger to be capable of driving the pull-up driver modules 130 and the pull-down driver modules 132, leading to an increase in the switching currents, current consumption, and voltage noise and, as whole, the quality of the output signal may suffer.

Furthermore, when driving the output, the output transistors may be gated while the pre-output driver circuits 126 and 128 may be consuming currents during the calibration period prior to the data readout. Moreover, the pull-down unit 124 may be used as on-die termination (ODT) and, thus, may be designed to operate linearly relative to the voltage. This specification may be associated with reduced target resistance of the transistor resistance to obtain a larger contribution of the resistive elements in the pull-down unit 124 (e.g., resistive element 145 and 149), which may have a more linear current-voltage behavior.

Figure 5A:
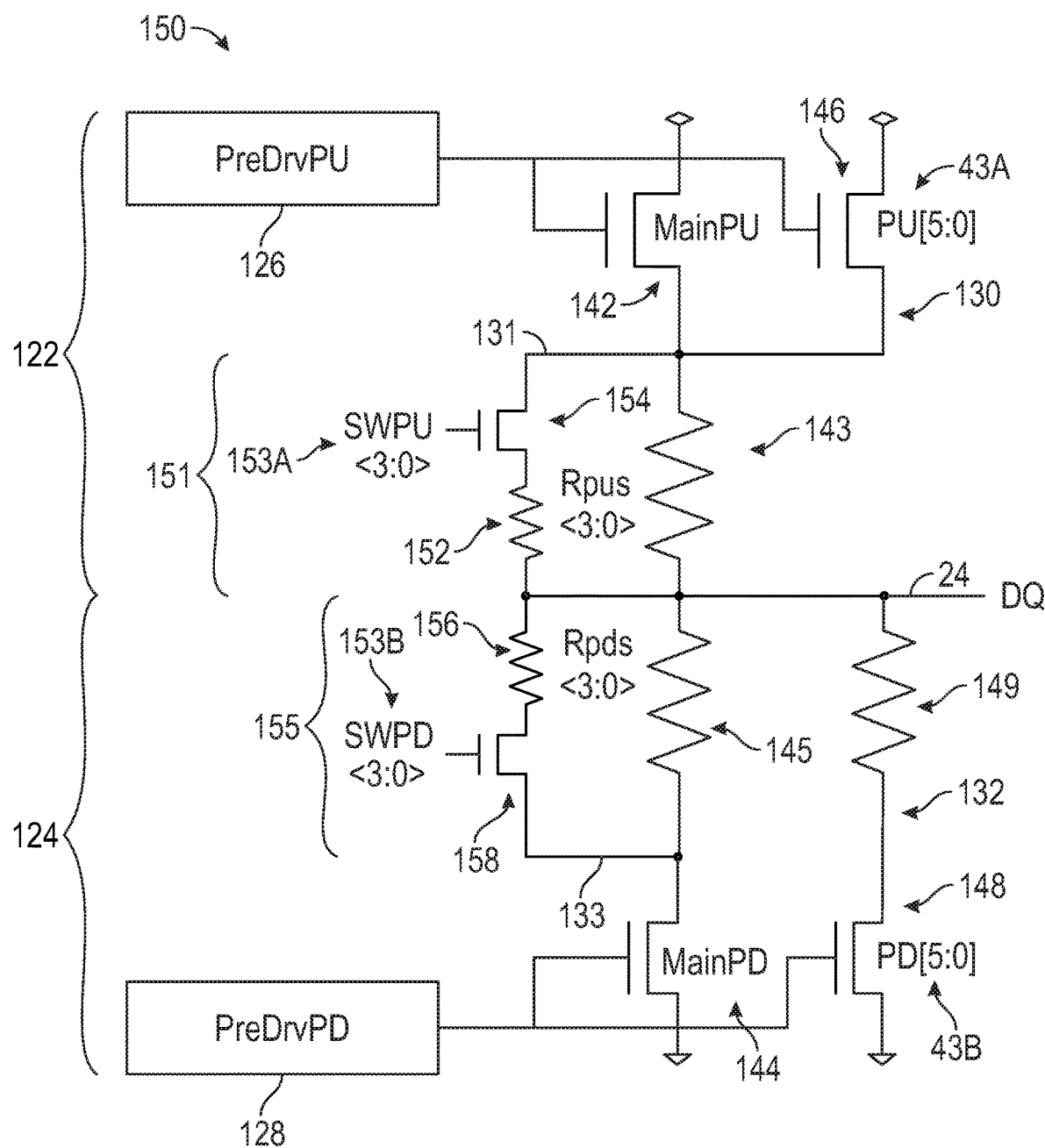
FIG. 5A is an electrical circuit illustrating a data output circuit with configurable circuitry that may perform fuse-based and switch-based adjustment of output impedance, in accordance with an embodiment.
Figure 5B:
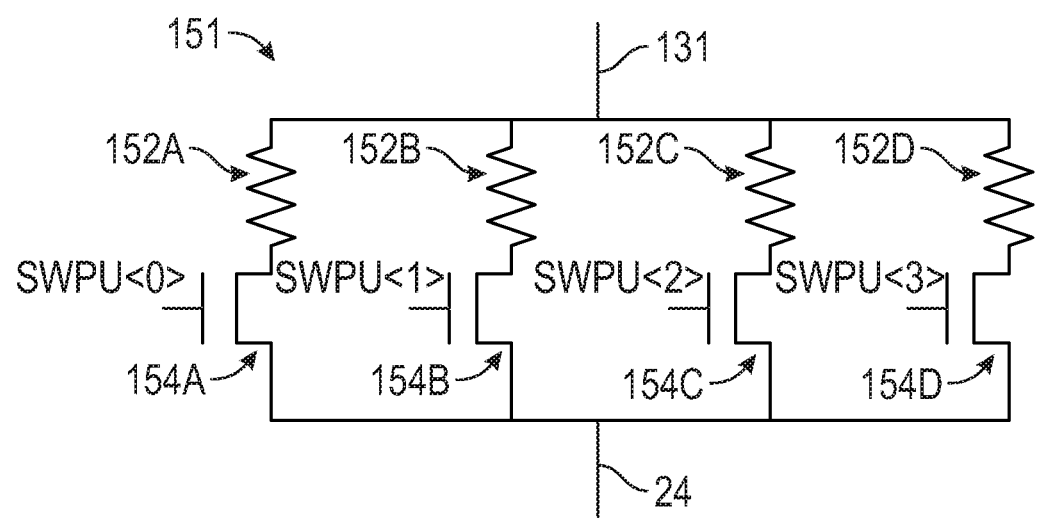
FIG. 5B is an electrical circuit of a pull-up configurable resistor circuit that may be used in the data output circuit of FIG. 5A, in accordance with an embodiment.
Figure 5C:
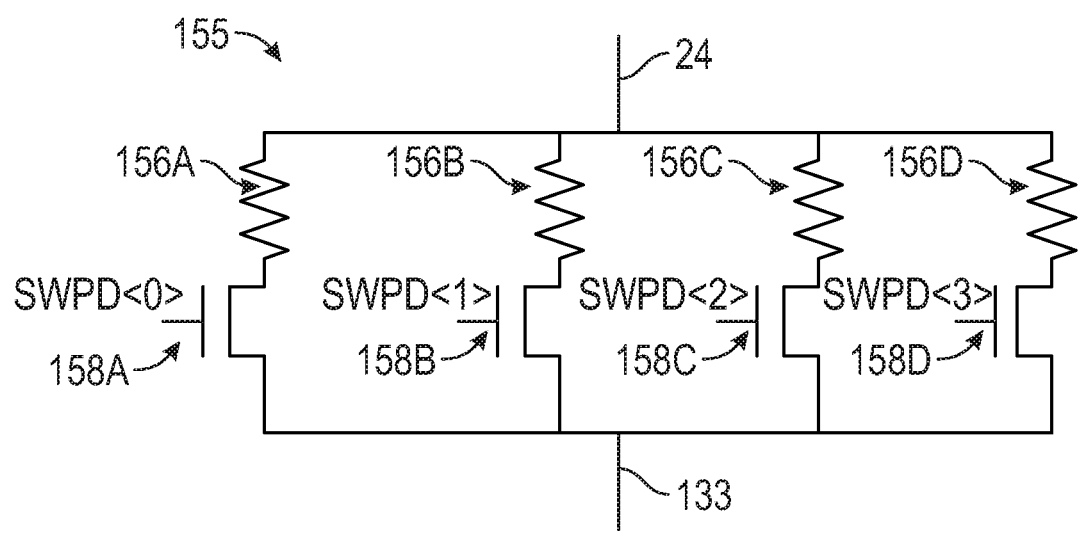
FIG. 5C is an electrical circuit of a pull-down configurable resistor circuit that may be used in the data output circuit of FIG. 5A, in accordance with an embodiment.

With the foregoing in mind, FIGS. 5A, 5B, and 5C illustrate an example of a data output circuit 150 having fuse-based and switch-based output impedance adjustment system. As with the data output circuit 140 of FIG. 4, the data output circuit 150 may have a pull-up unit 122 and a pull-down unit 124. The pull-up unit may have a pull-up pre-output driver 126 and a pull-up driver module 130. The pull-up driver module 130 may have the main pull-up driver 142 and the programmable pull-up drivers 146. The pull-up driver may be coupled to the data terminal 24 via resistive element 143. Moreover, the pull-up unit 122 may also have a pull-up configurable resistor circuit 151. Pull-up configurable resistor circuit 151 may have several transistors 154 and resistors 152, which may be disposed in a branches that are parallel with the resistive element 143. FIG. 5B illustrates an embodiment of the configurable resistor circuit 151 with 4 transistors 154A, 154B, 154C, and 154D and 4 resistors 152A, 152B, 152C, and 152D. As illustrated in FIG. 5B, the transistors 154A, 154B, 154C, and 154D may be used to place any of the respective resistors 152A, 152B, 152C, and 152D in parallel with the resistive element 143 and, thus, adjust the output impedance contribution from the pull-up unit 122.

Similarly, the pull-down unit 124 of the data output circuit 150 may be coupled to the data terminal 24 via resistive element 145. Moreover, the pull-down driver may also have a pull-down configurable resistor circuit 155. Configurable resistor circuit 155 may have several transistors 158 and resistors 156, which may be disposed in a branches that are parallel with the resistive element 145. FIG. 5C illustrates an embodiment of the configurable resistor circuit 155 with 4 transistors 158A, 158B, 158C, and 158D and 4 resistors 156A, 156B, 156C, and 156D. As illustrated in FIG. 5B, the transistors 158A, 158B, 158C, and 158D may be used to place any of the respective resistors 152A, 152B, 152C, and 152D in parallel with the resistive element 143 and, thus, adjust the output impedance contribution from the pull-up unit 122. Programming of the transistors in configurable resistor circuits 151 and 155 may take place through fuse signals 153A and 153B, respectively. Specifically, the fuse signal 153A may place a resistance in parallel with the resistive element by setting a corresponding fuse in a fuse-on configuration or, alternatively, may set the corresponding fuse in a fuse-off configuration to prevent the corresponding resistive element from affecting the output impedance. As such, the output impedance from the pull-up unit 122 and the pull-down unit 124 to the data terminal 24 may be adjusted using fuse signals 153A and 153B, and adjustment signals 43A and 43B.

In some embodiments, the adjustment of the fuse signals 153A and 153B may be fixed during the operation of the memory device 14. That is, upon a calibration process, the fuse signals 153A and 153B may be set to program the configurable resistor circuits 151 and 155. As a result, the transistors in the configurable resistor circuits 151 and 155 do not cause any currents due to switching. Moreover, as discussed above, the fuse signals 153A and 153B may focus on compensating for fluctuations stemming from the manufacturing process. Thus, the configuration of the configurable resistor circuits 151 and 155 may stay fixed for multiple cycles of operation of the memory device 14. As discussed above, the use of the configurable resistor circuits 151 and 155 reduce the amount of compensation requested from the programmable drivers 146 and 148, which may focus on fluctuations due temperature and/or voltage conditions. Reduction in the range of compensation from the programmable drivers 146 and 148 may allow the use of a simpler design that may employ less metallization. In some embodiments, the fuse signals 153A and 153B may be obtained from a stable power supply of the memory device 14, reducing any further fluctuations in the die. It should be noted that in some embodiments, fuse signal 153A and 153B may be generated by the ZQ calibration system, similar to the switch adjustment signals 43A and 43B.

Figure 6:
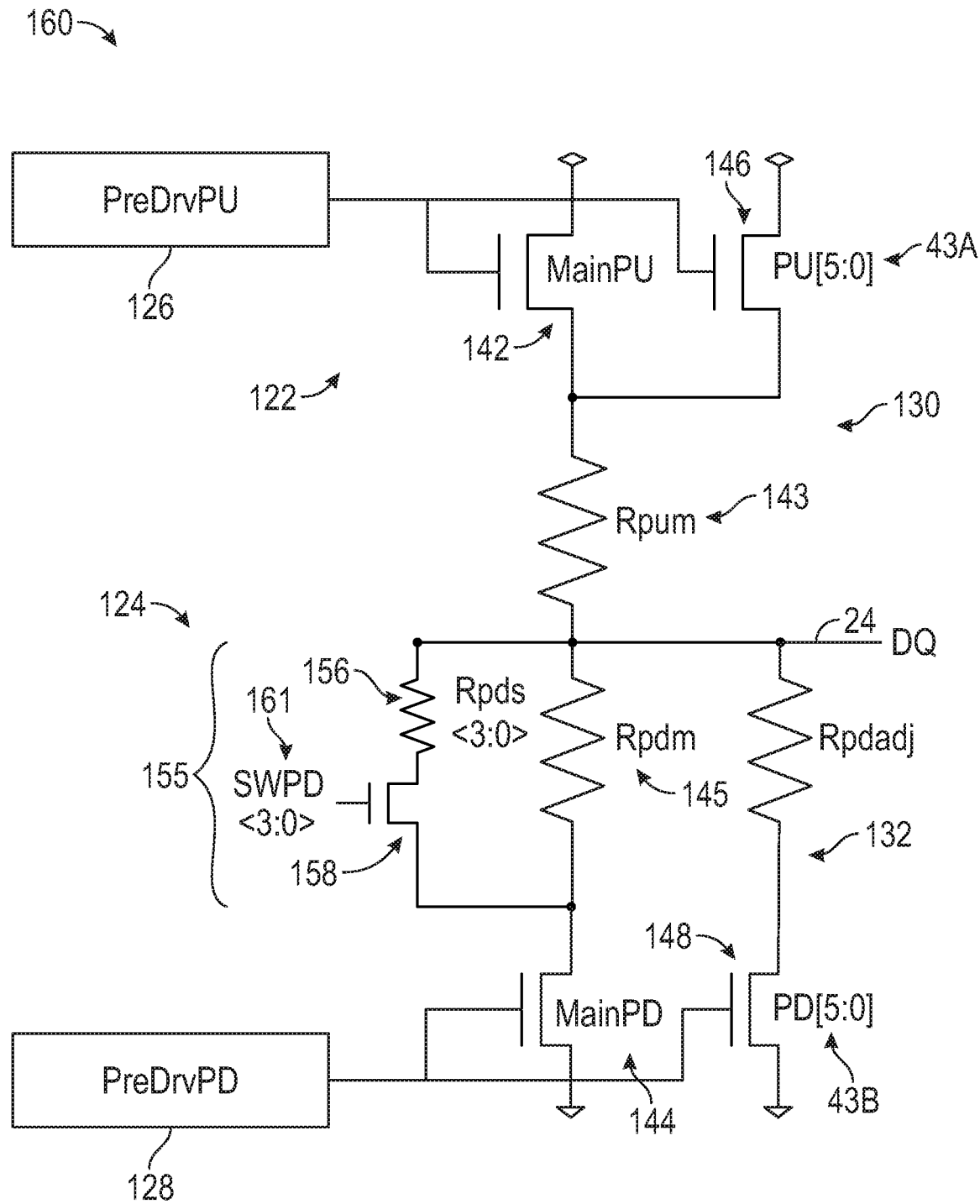
FIG. 6 is an electrical circuit illustrating another data output circuit with configurable circuitry that may perform fuse-based and switch-based adjustment of output impedance, in accordance with an embodiment.

FIG. 6 illustrates another embodiment of a data output circuit 160 having a fuse-based and switch-based output impedance adjustment system. As with the data output circuit 150 of FIG. 5, the data output circuit 160 may have a pull-up unit 122 and a pull-down unit 124. In the data output circuit 160, only the single pull-down configurable resistor circuit 155, in the pull-down unit 124, is present. In the data output circuit 160, the output impedance from the pull-up unit 122 may be adjusted using programmable pull-up drivers 146 and the output impedance from the pull-down unit 124 may be adjusted using programmable pull-down drivers 148 and/or the configurable resistor circuit 155. The data output circuit 160 may, therefore, have a simpler configurable resistance circuitry design than that of the data output circuit 150 of FIGS. 5A-C. Programming of the fuses in configurable resistor circuit 155 may take place through fuse signal 161. As such, the impedance from the pull-up unit 122 and the pull-down unit 124 to the data terminal 24 may be adjusted using signals 43A, 43B, and 161.

In some embodiments, the adjustment of the fuse signal 161 may be fixed during the operation of the memory device 14. That is, upon a calibration process, the fuse signal 161 may be set to program the configurable resistor circuit 155. As a result, the transistors in the configurable resistor circuit 155 do not lead to switching currents during operation. Moreover, as discussed above, the fuse signal 161 may focus on compensating for fluctuations stemming from the manufacturing process and the switch adjustment signals 43A and 43B may focus on compensating for fluctuations stemming from environmental conditions such as temperature and/or voltage. The programmable pull-up drivers 146 and the programmable pull-down drivers 148 may, thus, be dimensioned to provide a reduced range of compensation, as the configurable resistor circuit 155 facilitates compensation. Reduction in the range of compensation from the programmable drivers 146 and 148 may allow the use of a simpler design that may employ less metallization. In some embodiments, the fuse signal 161 may be obtained from a stable power supply of the memory device 14. It should be noted that in some embodiments, fuse signal 161 may be generated by the ZQ calibration system, similar to the switch adjustment signals 43A and 43B.

It should be understood that, while the above illustration describes switching circuitry implemented using n-type metal oxide semiconductor (NMOS) devices, the circuitry may be implemented using p-type metal oxide semiconductor (PMOS) devices. More generally, any other type of switches may be used in the circuitry described above.

Figure 7:
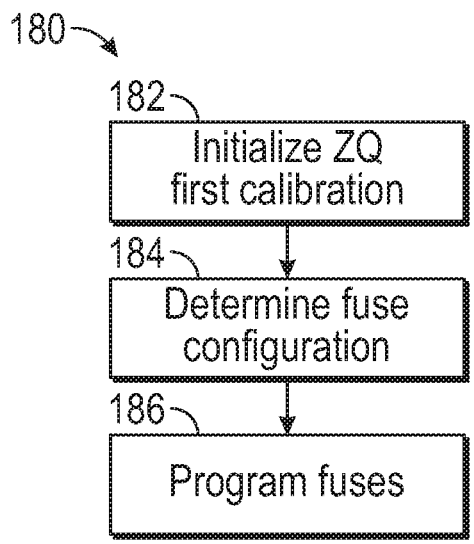
FIG. 7 is a flow chart for a method that may be used to perform fuse-based adjustment of output impedance in the data output circuitry, in accordance with an embodiment.

With the foregoing in mind, FIG. 7 illustrates a method 180 to program the configurable resistor circuitry such as the one described above. During the method 180, the memory device may initiate a ZQ calibration in process block 182. During the ZQ calibration, the memory device may sense the resulting voltages from an output terminal that is coupled to the reference voltage and the reference output resistance RZQ. In accordance with the sensed voltages, the memory device may select which fuses should be switched ON or OFF in process block 184. The selected fuses may provide uniform output impedance between the multiple output drivers, to mitigate the amount of individual adjustment during ZQ calibrations. In process block 186, the fuses may be programmed by coupling the fuse transistors (e.g., gate of the fuse transistors) to the appropriate power signal. As discussed above, the electrical coupling established in process block 186 may be a fixed connection, which may survive multiple reset cycles of the device.

Figure 8:
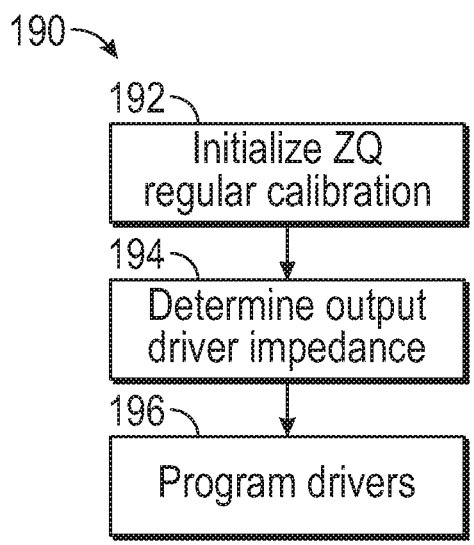
FIG. 8 is a flow chart for a method that may be used to perform switch-based adjustment of output impedance in a data output circuitry having configurable resistor circuitry, in accordance with an embodiment.

FIG. 8 illustrates a method 190 to program the ZQ switches in memory devices that include the above-described fuse-based configurable resistor circuitry. During the method 190, the memory device may initiate a ZQ calibration in process block 192. During process block 194, the memory device may select the appropriate switches that configure the output data impedance. During process block 196, the ZQ calibration controller 42 may generate a programming signal that is provided to the ZQ switches in the data output drivers. In some embodiments, the method 190 may be performed more frequently than the method 180 of FIG. 7. For example, the method 190 may be performed prior to initiating the transmission of data that results from a read data request, whereas the method 180 may performed during a reset of the entire die. This scheduling of ZQ calibrations may decrease the amount of switch currents in the transistors due to the ZQ calibration, as the fuse do not generate switch currents.

Figure 9:
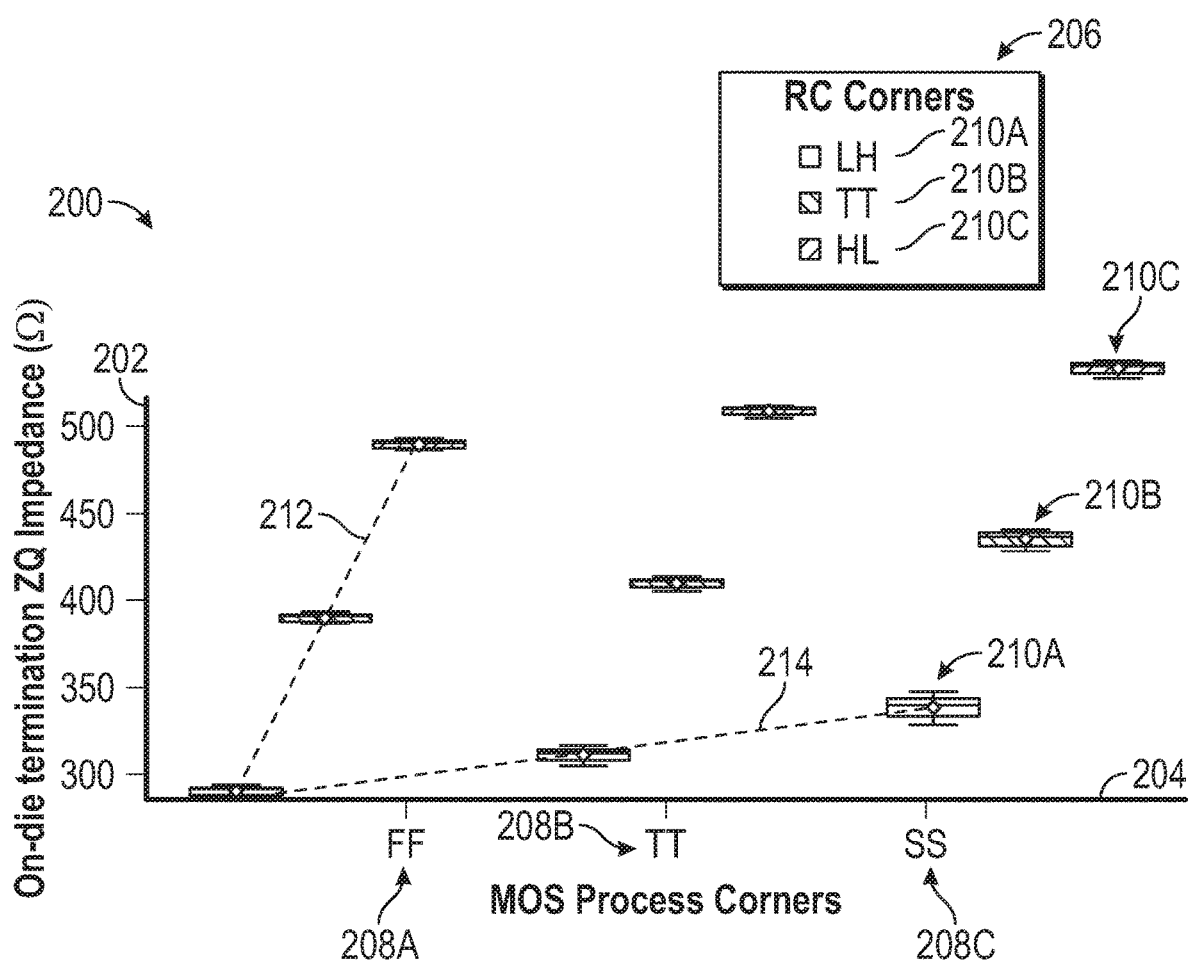
FIG. 9 is a chart illustrating the sources of manufacture variations that may be compensated using the fuse-based methods and systems, in accordance with an embodiment.

FIG. 9 provides a chart 200 that illustrates the variations due to the manufacturing. FIG. 9 provides the on-die termination ZQ impedance 202 as a function of metal-oxide-semiconductor (MOS) process fluctuations 204 and RC fluctuations 206. Specifically, the MOS process fluctuations 204 include the corner cases of fast PMOS fast NMOS (FF) 208A, typical PMOS typical NMOS (TT) 208B and slow PMOS slow NMOS (SS) 208C. The RC fluctuations 206 focus on the corner cases of low resistance high capacitance 210A, typical resistance typical capacitance 210B, and high resistance low capacitance 210C. By analyzing the corner cases of MOS process fluctuations 204 and the RC fluctuations 206, the chart 200 illustrates the amount of variation due to the different variables of the manufacture process. As illustrated, the variations in the ZQ impedance 202 due to RC fluctuations (illustrated by line 212) is substantially larger than the variations in the ZQ impedance 202 due to MOS process fluctuations (illustrated by line 214). Moreover, variations in the ZQ impedance 202 due to the RC fluctuations are substantial, ranging from 300Ω to 500Ω in the simulation system. This chart, thus, illustrates the impact caused by the use of fuse-based system in reducing the compensation range of the switch-based ZQ calibration circuitry.

While the embodiments set forth in the present disclosure may be susceptible to various modifications and alternative forms, specific embodiments have been shown by way of example in the drawings and have been described in detail herein. However, it may be understood that the disclosure is not intended to be limited to the particular forms disclosed. The disclosure is to cover all modifications, equivalents, and alternatives falling within the spirit and scope of the disclosure as defined by the following appended claims.

What is claimed is:

1. An apparatus comprising:
  an output node;
  pull-up circuitry comprising a pull-up transistor coupled between a first voltage node and a first intermediate node and a first resistor coupled between the first intermediate node and the output node;
  pull-down circuitry comprising a pull-down transistor coupled between a second voltage node and a second intermediate node and a second resistor coupled between the second intermediate node and the output node;
  a first configurable resistor coupled between the output node and one of either the first intermediate node or the second intermediate node, wherein the first configurable resistor comprises a plurality of parallel branches, wherein each respective branch comprises a respective transistor and a respective branch resistor, and couples to the output node and the one of either the first intermediate node or the second intermediate node; and
  a fuse circuit configured to provide a plurality of fuse signals to configure the first configurable resistor, wherein each respective fuse signal of the plurality of fuse signals is provided to a respective gate of the respective transistor of the respective parallel branch.

2. The apparatus of claim 1, comprising a second configurable resistor disposed between the output node and the second intermediate node if the first configurable resistor is coupled between the output node and the first intermediate node or disposed between the output node and the first intermediate node if the first configurable resistor is coupled between the output node and the second intermediate node.

3. The apparatus of claim 1, wherein each respective resistance of each respective branch of the plurality of parallel branches has a different resistance value.

4. The apparatus of claim 3, wherein each respective transistor of each respective branch of the plurality of parallel branches is configured based on the respective resistance value.

5. The apparatus of claim 1, wherein a first resistance value of a first branch resistor of a first branch of the plurality of parallel branches is different from a second resistance value of the first resistor and the second resistor.

6. The apparatus of claim 1, comprising:
  second pull-down circuitry comprising a second pull-down transistor coupled between the second voltage node and a third intermediate node and a third resistor coupled between the third intermediate node and the output node, wherein the third intermediate node is disconnected from the second intermediate node.

7. The apparatus of claim 6, wherein the second pull-down transistor is controlled responsive to a calibration adjustment signal generated by a ZQ calibration and the pull-down transistor is controlled independent of the calibration adjustment signal.

8. The apparatus of claim 6, comprising:
  second pull-up circuitry comprising a second pull-up transistor coupled between the first voltage node and the first intermediate node.

9. The apparatus of claim 1, wherein each respective fuse comprises a p-type metal oxide transistor (PMOS) or a n-type metal oxide transistor (NMOS).

10. The apparatus of claim 1, comprising a pre-output pull-up driver and a pre-output pull-down driver that receive data from a memory cell of the apparatus, wherein the pre-output pull-up driver provides a pull-up command when the data from the memory cell is associated with a high voltage and the pre-output pull-down driver provides a pull-down command when the data from the memory cell is associated with a low voltage.

11. A memory device, comprising data output circuitry that comprises:
a pull-up unit comprising a pre-output pull-up driver and a plurality of pull-up output drivers, wherein the pre-output pull-up driver is configured to receive data from a memory cell of the memory device and to provide a pull-up command to the plurality of pull-up output drivers; and
a pull-down unit comprising a pre-output pull-down driver and a plurality of pull-down output drivers, wherein the pre-output pull-down driver is configured to receive the data and to provide a pull-down command to the plurality of pull-down output drivers;
wherein each respective pull-up output driver is coupled to an output data port of the memory device via a respective pull-up resistor; and
wherein each respective pull-down output driver is coupled to the output data port of the memory device via a respective pull-down resistor and a respective pull-down configurable resistor that comprises a respective plurality of parallel branches coupled to the output data port and to the respective pull-down output driver, wherein each respective pull-up output driver is coupled to the output data port of the memory device via a respective pull-up configurable resistor that comprises a second respective plurality of parallel branches coupled to the output data port and to the respective pull-up output driver.

12. The memory device of claim 11, comprising fuse circuitry configured to provide a plurality of signals to each respective pull-down configurable resistor, wherein each signal of the plurality of signals is provided to a respective gate of a respective transistor disposed in a respective parallel branch of the respective pull-down configurable resistor.

13. The memory device of claim 11, wherein the respective pull-down configurable resistor is configured do adjust an output impedance to the output data port by adjusting each respective resistance of each parallel branch of the respective pull-down configurable resistor.

14. The memory device of claim 11, wherein each respective fuse device comprises a p-type metal-oxide-semiconductor (PMOS) or a n-type metal-oxide-semiconductor (NMOS).

15. The memory device of claim 11, wherein each respective pull-up output driver comprises a respective main pull-up device and respective pull-up switches disposed in parallel with the respective main pull-up device, wherein the respective main pull-up device and the respective pull-up switches are configured to receive the pull-up command.

16. The memory device of claim 11, wherein each respective pull-down output driver comprises a respective main pull-down device and respective pull-down switches disposed in parallel with the respective main pull-down device and the respective pull-down resistor, wherein the respective main pull-down device and the respective pull-down switches are configured to receive the pull-down command.

17. A method to perform output impedance calibration in a memory device, the method comprising:
sensing a voltage in a sensor of calibration circuitry of the memory device, wherein the voltage is produced by a reference voltage and a reference impedance;
adjusting, in a fuse circuit of the memory device, a configurable resistor of a data output circuit of the memory device, wherein the data output circuit comprises a main driver, the configurable resistor comprises a plurality of parallel branches, each parallel branch comprising a respective branch resistor and a respective branch transistor and, wherein adjusting the configurable resistor in the fuse circuit comprises coupling a subplurality of the plurality of parallel branches to a data output port and to the main driver by providing to each respective parallel branch:
a branch-on gate signal for each respective branch transistor of a respective branch in the subplurality of the plurality parallel branches; or
a branch-off gate signal for each respective branch transistor of the respective branch not in the subplurality of the plurality of parallel branches.

18. The method of claim 17, comprising:
sensing a second voltage in the sensor of the calibration circuitry after the adjustment of the configurable resistor by the fuse circuit;
selecting a configuration for switch circuitry of the data output circuit, wherein the switch circuitry comprises a switchable driver disposed in parallel with the main driver; and
transmitting a switch control command to the switch circuitry of the data output circuit.

19. The method of claim 18, wherein the adjustment of the configurable resistor is configured to compensate for fluctuations in an output impedance due to a manufacturing process and the configuration of the switch circuitry is configured to compensate for fluctuations in the output impedance due to environmental conditions.

20. An apparatus comprising:
an output node;
pull-up circuitry comprising a pull-up transistor coupled between a first voltage node and a first intermediate node and a first resistor coupled between the first intermediate node and the output node;
pull-down circuitry comprising a pull-down transistor coupled between a second voltage node and a second intermediate node and a second resistor coupled between the second intermediate node and the output node;
a first configurable resistor coupled between the output node and one of either the first intermediate node or the second intermediate node; and
second pull-down circuitry comprising a second pull-down transistor coupled between the second voltage node and a third intermediate node and a third resistor coupled between the third intermediate node and the output node, wherein the third intermediate node is disconnected from the second intermediate node, wherein the second pull-down transistor is controlled responsive to a calibration adjustment signal generated by a ZQ calibration and the pull-down transistor is controlled independent of the calibration adjustment signal.

21. A memory device, comprising data output circuitry that comprises:
a pull-up unit comprising a pre-output pull-up driver and a plurality of pull-up output drivers, wherein the pre-output pull-up driver is configured to receive data from a memory cell of the memory device and to provide a pull-up command to the plurality of pull-up output drivers; and a pull-down unit comprising a pre-output pull-down driver and a plurality of pull-down output drivers, wherein the pre-output pull-down driver is configured to receive the data and to provide a pull-down command to the plurality of pull-down output drivers;

wherein each respective pull-up output driver is coupled to an output data port of the memory device via a respective pull-up resistor;

wherein each respective pull-down output driver is coupled to the output data port of the memory device via a respective pull-down resistor and a respective pull-down configurable resistor that comprises a respective plurality of parallel branches coupled to the output data port and to the respective pull-down output driver; and fuse circuitry configured to provide a plurality of signals to each respective pull-down configurable resistor, wherein each signal of the plurality of signals is provided to a respective gate of a respective transistor disposed in a respective parallel branch of the respective pull-down configurable resistor.

22. A memory device, comprising data output circuitry that comprises:

a pull-up unit comprising a pre-output pull-up driver and a plurality of pull-up output drivers, wherein the pre-output pull-up driver is configured to receive data from a memory cell of the memory device and to provide a pull-up command to the plurality of pull-up output drivers; and a pull-down unit comprising a pre-output pull-down driver and a plurality of pull-down output drivers, wherein the pre-output pull-down driver is configured to receive the data and to provide a pull-down command to the plurality of pull-down output drivers;

wherein each respective pull-up output driver is coupled to an output data port of the memory device via a respective pull-up resistor;

wherein each respective pull-down output driver is coupled to the output data port of the memory device via a respective pull-down resistor and a respective pull-down configurable resistor that comprises a respective plurality of parallel branches coupled to the output data port and to the respective pull-down output driver; and wherein each respective pull-up output driver comprises a respective main pull-up device and respective pull-up switches disposed in parallel with the respective main pull-up device, wherein the respective main pull-up device and the respective pull-up switches are configured to receive the pull-up command.

23. The memory device of claim 22, wherein each respective pull-down output driver comprises a respective main pull-down device and respective pull-down switches disposed in parallel with the respective main pull-down device and the respective pull-down resistor, wherein the respective main pull-down device and the respective pull-down switches are configured to receive the pull-down command.

* * * * *